(12) United States Patent
Yabe et al.

(10) Patent No.: US 10,281,634 B2
(45) Date of Patent: May 7, 2019

(54) LIGHT SOURCE APPARATUS

(71) Applicant: MITSUBISHI ELECTRIC CORPORATION, Tokyo (JP)

(72) Inventors: Mitoru Yabe, Tokyo (JP); Yukio Sato, Tokyo (JP); Takumi Kijima, Tokyo (JP); Motoaki Tamaya, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 13/887,809

(22) Filed: May 6, 2013

(65) Prior Publication Data
US 2013/0335993 A1 Dec. 19, 2013

(30) Foreign Application Priority Data

Jun. 14, 2012 (JP) .................................. 2012-134650

(51) Int. Cl.
*F21V 8/00* (2006.01)
*G02B 6/04* (2006.01)
(Continued)

(52) U.S. Cl.
CPC ......... *G02B 6/0005* (2013.01); *G02B 6/4269* (2013.01); *H01S 5/02284* (2013.01);
(Continued)

(58) Field of Classification Search
CPC .. G02B 6/0006; G02B 6/0008; G02B 6/4298; G02B 6/0005; G02B 6/001; G02B 6/4269; G02B 6/04; B60Q 1/0011; F21Y 2101/02; F21K 9/00; F21W 2121/00; F21S 10/005; H01S 5/02284; H01S 5/02469; H01S 5/4012
(Continued)

(56) References Cited

U.S. PATENT DOCUMENTS 5,779,353 A * 7/1998 Kacheria ............... F21S 10/005
362/293
5,898,805 A * 4/1999 Kanazawa ............... B41J 2/471
359/216.1
(Continued)

FOREIGN PATENT DOCUMENTS

CN 2568958 Y 8/2003
CN 1501334 A 6/2004
(Continued)

*Primary Examiner* — Alexander K Garlen
*Assistant Examiner* — Colin J Cattanach
(74) *Attorney, Agent, or Firm* — Birch, Stewart, Kolasch & Birch, LLP

(57) ABSTRACT

A light source apparatus includes a plurality of light source modules each including at least one light source unit, light guide lines connected respectively to the light source units, and a casing accommodating the plurality of light source modules and the plurality of light guide lines. The light guide lines are led from the light source units so as not to intervene in the plurality of light source modules when viewed in a direction perpendicular to an array direction of the plurality of light source modules. The plurality of light source modules are separately attachable and detachable in the direction perpendicular to the array direction of the plurality of light source modules.

17 Claims, 9 Drawing Sheets

(51) Int. Cl.
*G02B 6/42* (2006.01)
*H01S 5/40* (2006.01)
*H01S 5/022* (2006.01)
*H01S 5/024* (2006.01)

(52) U.S. Cl.
CPC ........ *H01S 5/02469* (2013.01); *H01S 5/4025* (2013.01); *G02B 6/0006* (2013.01); *G02B 6/0008* (2013.01); *G02B 6/04* (2013.01); *H01S 5/024* (2013.01)

(58) Field of Classification Search
USPC .................... 362/551, 554, 553, 555, 565
See application file for complete search history.

(56) References Cited

U.S. PATENT DOCUMENTS

| | | | | |
|---|---|---|---|---|
| 6,124,906 | A * | 9/2000 | Kawada | G02B 6/00 349/62 |
| 6,766,095 | B1 * | 7/2004 | Bjorklund | 385/135 |
| 6,832,849 | B2 * | 12/2004 | Yoneda et al. | 362/551 |
| 7,157,838 | B2 | 1/2007 | Thielemans et al. | |
| 7,841,740 | B2 | 11/2010 | Zhou et al. | |
| 7,954,985 | B2 * | 6/2011 | Bisnack | 362/494 |
| 8,282,256 | B1 * | 10/2012 | Pike et al. | 362/555 |
| 8,283,565 | B2 | 10/2012 | Yagisawa et al. | |
| 8,529,090 | B2 * | 9/2013 | Liou et al. | 362/249.02 |
| 8,651,704 | B1 * | 2/2014 | Gordin et al. | 362/294 |
| 2002/0054615 | A1 | 5/2002 | Nagamatsu et al. | |
| 2003/0147254 | A1 | 8/2003 | Yoneda et al. | |
| 2004/0135482 | A1 | 7/2004 | Thielemans et al. | |
| 2006/0029114 | A1 | 2/2006 | Kohda et al. | |
| 2008/0037273 | A1 * | 2/2008 | Muehlemann et al. | 362/581 |
| 2008/0205053 | A1 * | 8/2008 | Rains et al. | 362/231 |
| 2009/0000809 | A1 | 1/2009 | Yagisawa et al. | |
| 2009/0244894 | A1 | 10/2009 | Zhou et al. | |
| 2009/0322985 | A1 | 12/2009 | Mizuuchi | |
| 2010/0182573 | A1 * | 7/2010 | Itoh et al. | 353/30 |
| 2010/0220469 | A1 * | 9/2010 | Ivey et al. | 362/218 |
| 2013/0070453 | A1 | 3/2013 | Chiba et al. | |

FOREIGN PATENT DOCUMENTS

| | | |
|---|---|---|
| CN | 200956227 Y | 10/2007 |
| CN | 101105268 A | 1/2008 |
| CN | 101319768 A | 12/2008 |
| CN | 101495912 A | 7/2009 |
| CN | 101545614 A | 9/2009 |
| CN | 101582560 A | 11/2009 |
| CN | 201821002 U | 5/2011 |
| CN | 201966488 U | 9/2011 |
| JP | 2000-199833 A | 7/2000 |
| JP | 2001-68769 A | 3/2001 |
| JP | 2002-95624 A | 4/2002 |
| JP | 2004-125861 A | 4/2004 |
| JP | 2004-361439 A | 12/2004 |
| JP | 2005-300979 A | 10/2005 |
| JP | 2006-49605 A | 2/2006 |
| JP | 2006-60033 A | 3/2006 |
| JP | 2008-210962 A | 9/2008 |
| JP | 2009-86273 A | 4/2009 |
| JP | 2009-253074 A | 10/2009 |
| JP | 2010-170835 A | 8/2010 |
| JP | 2011-198588 A | 10/2011 |
| WO | WO 2011/152217 A1 | 12/2011 |

* cited by examiner

F I G. 4
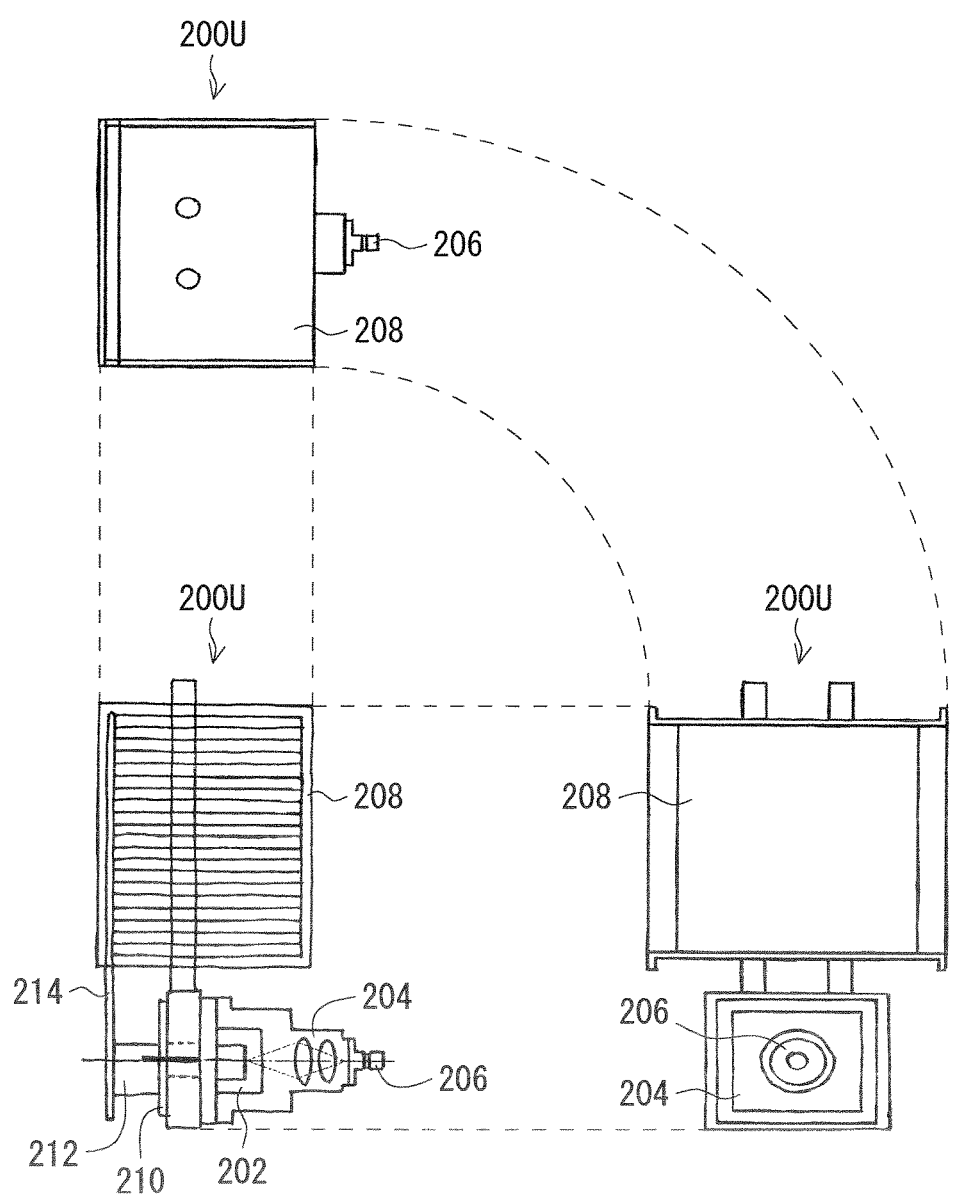

LIGHT SOURCE APPARATUS

BACKGROUND OF THE INVENTION

Field of the Invention

The present invention relates to a light source apparatus.

Description of the Background Art

There is a conventional high-power laser apparatus as described in Japanese Patent Application Laid-Open No. 2009-253074. In this laser apparatus, a plurality of laser light emitting units arrayed on an installation plate (also serving as cooling plate), and optical fibers connected respectively to the laser light emitting units. These optical fibers are bundled and led from the main body of the apparatus.

This laser apparatus further includes slider means for shifting the installation plate, which is equipped with the plurality of laser light emitting units, in a direction (horizontal direction) perpendicular to the array direction of the laser light emitting units. This slider means is capable of shifting the installation plate between an installed position inside the main body and an extracted position outside the main body. More particularly, the installation plate is shifted to the extracted position for maintenance work on any one of the laser light emitting units.

The optical fibers are led from the laser light emitting units in a direction inclined from long sides of the installation plate, and gradually curve so as to be parallel to the long sides on the installation plate. The plurality of optical fibers thus brought to be in parallel with each other are bundled to form a bundled portion of the optical fibers. Each of the optical fibers is set so as to curve within an acceptable curvature angle as well as so as to bring the bundled portion close to the end portion of the optical fiber led from corresponding one of the laser light emitting units. Such curvature is considered to achieve reduction in size of the apparatus. The led portion of each of the optical fibers is deformable along with the shifting installation plate.

According to the conventional technique described above, however, even for maintenance work on only one of the laser light emitting units, the installation plate equipped with the plurality of laser light emitting units needs to be entirely shifted to the extracted position. This requires a wide maintenance space outside the main body. The plurality of laser light emitting units are equipped on the entire installation plate, so that the slider means therefor needs to be on a large scale. Such large-scale slider means increases the cost for the apparatus.

The optical fibers are led onto the installation plate equipped with the laser light emitting units and are bundled on the installation plate. It is thus necessary to secure, on the installation plate, an allocation space for the laser light emitting units as well as a space (occasionally referred to as forming space) for the curved optical fibers. This leads to increase in size of the installation plate and inhibits reduction in size of the laser apparatus.

SUMMARY OF THE INVENTION

It is an object of the present invention to provide a technique for achieving, in a light source apparatus, improvement in maintenance performance, reduction in cost, reduction in size, and the like.

According to an aspect of the present invention, a light source apparatus includes a plurality of light source modules each including at least one light source unit, light guide lines connected respectively to the light source units, and a casing accommodating the plurality of light source modules and the light guide lines. The light guide lines are led from the light source units so as not to intervene in the plurality of light source modules when viewed in a direction perpendicular to an array direction of the plurality of light source modules. The plurality of light source modules are separately attachable and detachable in the direction perpendicular to the array direction of the plurality of light source modules.

The aspect described above achieves preferred maintenance performance. This aspect also achieves reduction in size, reduction in cost, and the like.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is an outer view illustrating a light source unit according to the preferred embodiment;

DESCRIPTION OF THE PREFERRED EMBODIMENTS

Described below is a case where a light source apparatus 1 according to a preferred embodiment is used as a light source of a projector which is an example of display equipment, although the light source apparatus 1 can be used for any purposes other than such a case.

Figure 1:
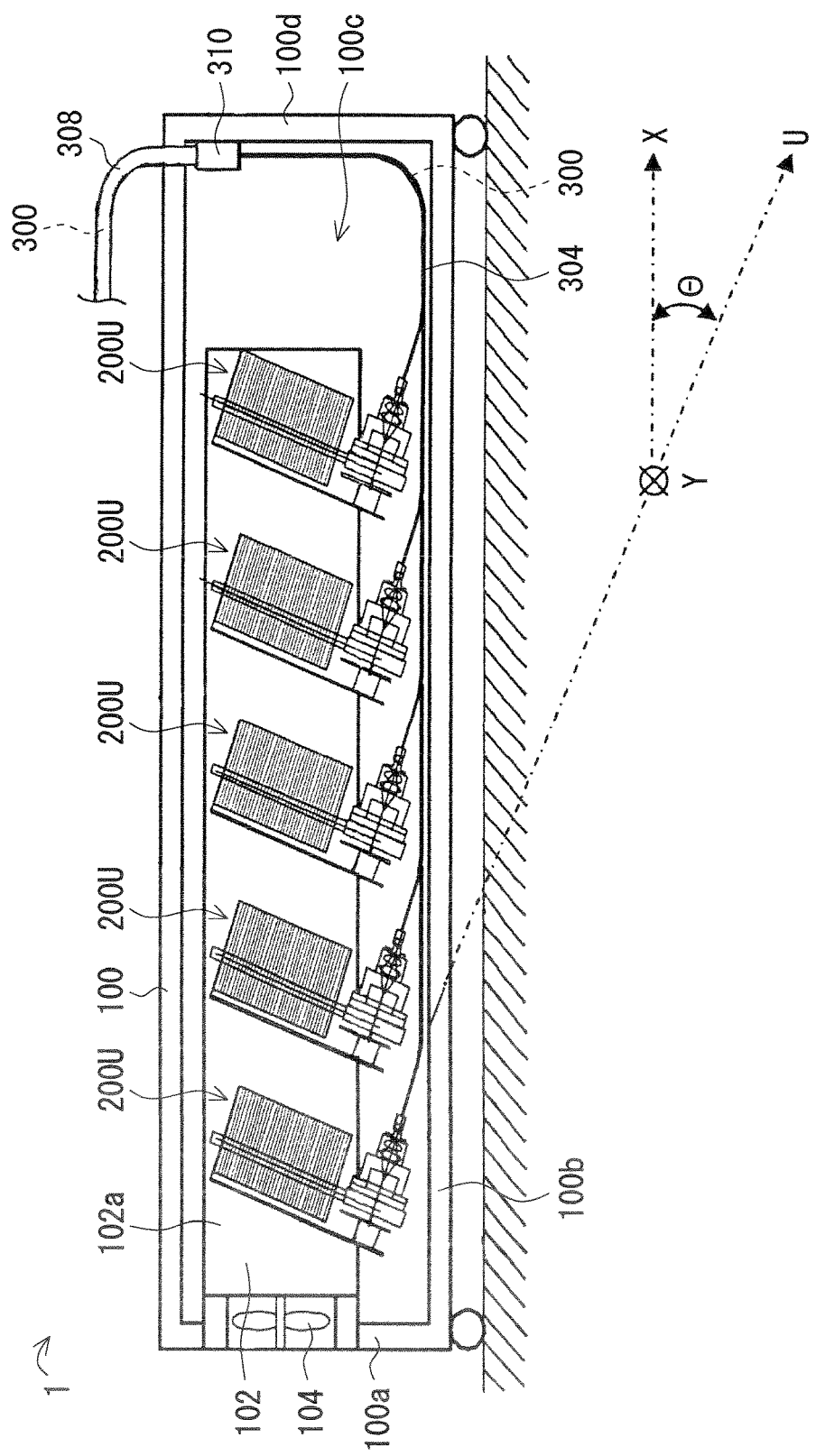
FIG. 1 is a front view illustrating a light source apparatus according to a preferred embodiment.
Figure 2:
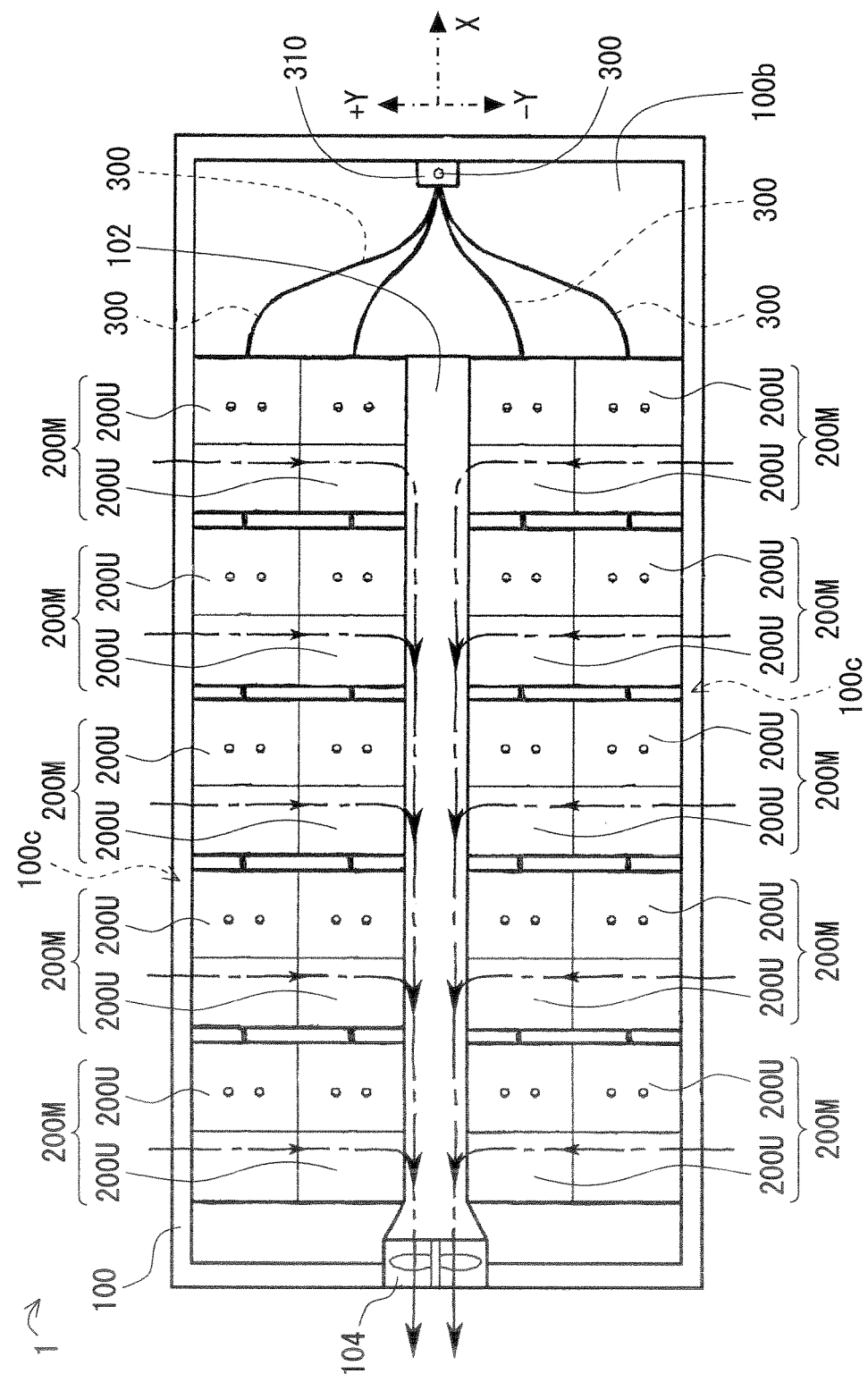
FIG. 2 is a top view illustrating the light source apparatus according to the preferred embodiment.
Figure 3:
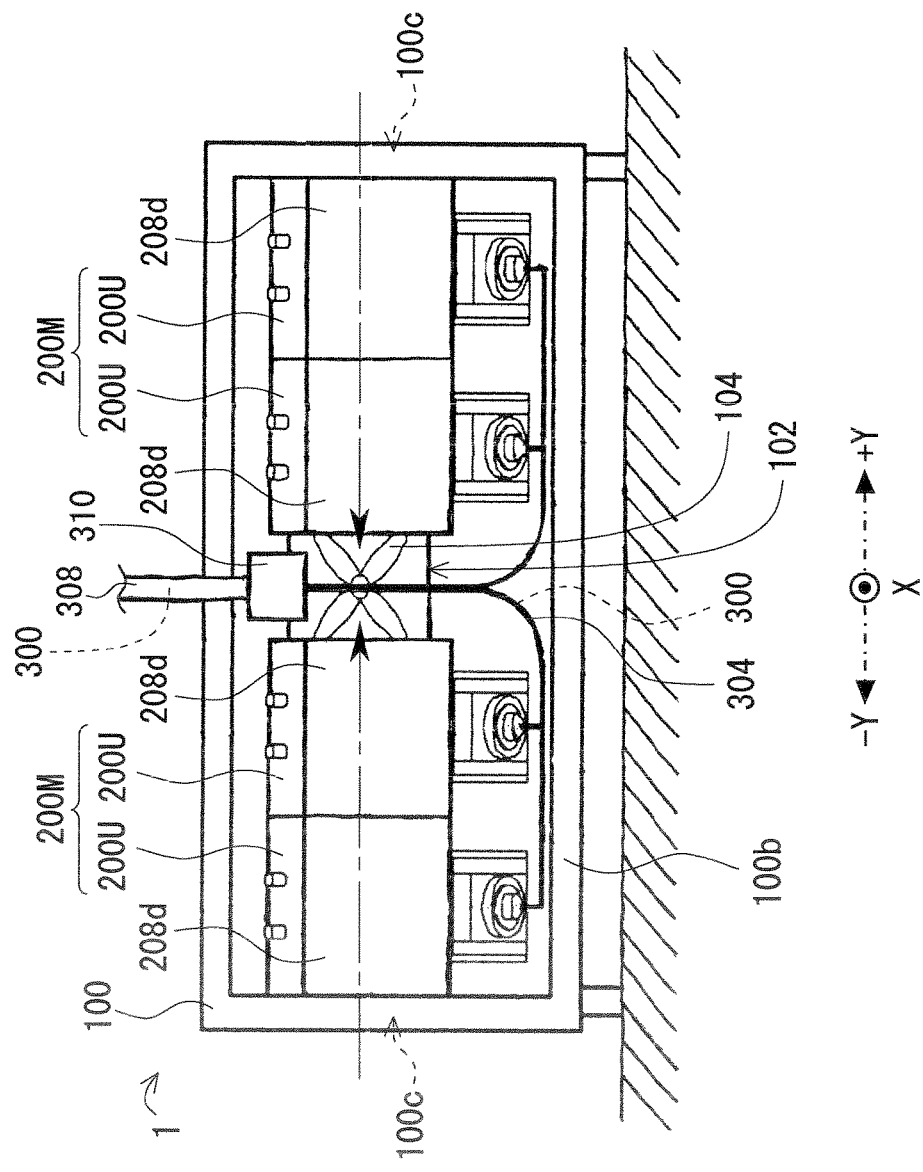
FIG. 3 is a side view illustrating the light source apparatus according to the preferred embodiment.

FIGS. 1 to 3 exemplify the structure of the light source apparatus 1. FIGS. 1 to 3 are a front view, a top view, and a side view, respectively. These views have modified depiction where appropriate, in order to show the internal structure. FIGS. 1 and 3 are referred to herein as the front view and the side view, respectively, although these figures can be referred to vice versa.

The light source apparatus 1 includes a casing 100, a plurality of light source modules 200M, and a plurality of light guide lines 300. The numbers of these components are not limited to those shown in the figures. For example, each of the light source modules 200M includes two light source units 200U in the example shown in FIGS. 1 to 3. Alternatively, each of the light source modules 200M can include only one light source unit 200U, or three or more light source units 200U.

<Casing 100>

The casing 100 is a member accommodating the plurality of light source modules 200M and the plurality of light guide lines 300, and has a substantially rectangular parallelepiped shape in the figures. In order to show the internal structure, FIGS. 1 and 3 do not depict a side surface portion of the casing 100, whereas FIG. 2 does not depict an upper surface portion of the casing 100. The casing 100 has a duct 102 and a fan 104.

The duct 102 extends inside the casing 100 along a long-side direction X of the casing 100 (hereinafter, also referred to as X direction), and is positioned at the center of the casing 100 in a short-side direction Y (hereinafter, also referred to as Y direction). Exemplified herein is a case where the X direction is perpendicular to the Y direction, and these directions are parallel to the horizontal plane. As shown in FIGS. 2 and 3, the Y direction is occasionally divided into a +Y direction and a −Y direction at the position of the duct 102.

The fan 104 is attached to an end portion of the duct 102. The fan 104 is located in a side surface portion 100a perpendicular to the X direction of the casing 100, and ventilates from inside to outside the casing as indicated by dashed lines in FIGS. 2 and 3. Alternatively, the direction of ventilation can be reversed.

The figures exemplify a case where the duct 102 is installed so as to be suspended in midair in the casing 100. The duct 102 can be alternatively installed so as to reach one or both of a bottom surface portion 100b and the upper surface portion (not shown) of the casing 100.

The present preferred embodiment exemplifies an air cooling system, whereas it is possible to alternatively use gas or liquid of a substance other than air as a refrigerant. In view of this point, the duct 102 can be referred to as a refrigerant channel 102 and the fan 104 can be referred to as a flow generator 104. As to be described later, the duct 102 provides a refrigerant channel common for the plurality of laser light emitting modules 200M.

The casing 100 has opening portions 100c at both ends in the Y direction, more specifically, at the end in the +Y direction and at the end in the −Y direction. The opening portions 100c can serve as work windows for maintenance work (including replacement of a component). These opening portions 100c are each covered with a lid member (not shown) of the casing 100 while the light source apparatus 1 is in use. In other words, the casing 100 is configured to be capable of opening the inner space of the casing 100 to outside the casing in both of the +Y direction and the −Y direction.

The opening portions 100c at the respective ends can be connected with each other at the top of the casing 100. Such connected opening portions also provide the structure in which the inner space of the casing 100 is openable to outside the casing in both of the +Y direction and the −Y direction.

<Light Source Units 200U and Light Source Modules 200M>

Exemplified as the light source units 200U are laser light emitting units employing laser light, and the light source units 200U are also referred to as laser light emitting units 200U. In accordance therewith, the light source modules 200M are also referred to as the laser light emitting modules 200M. It is noted that a light source portion of each of the light source units 200U is not limited to a laser light source.

Figure 5:
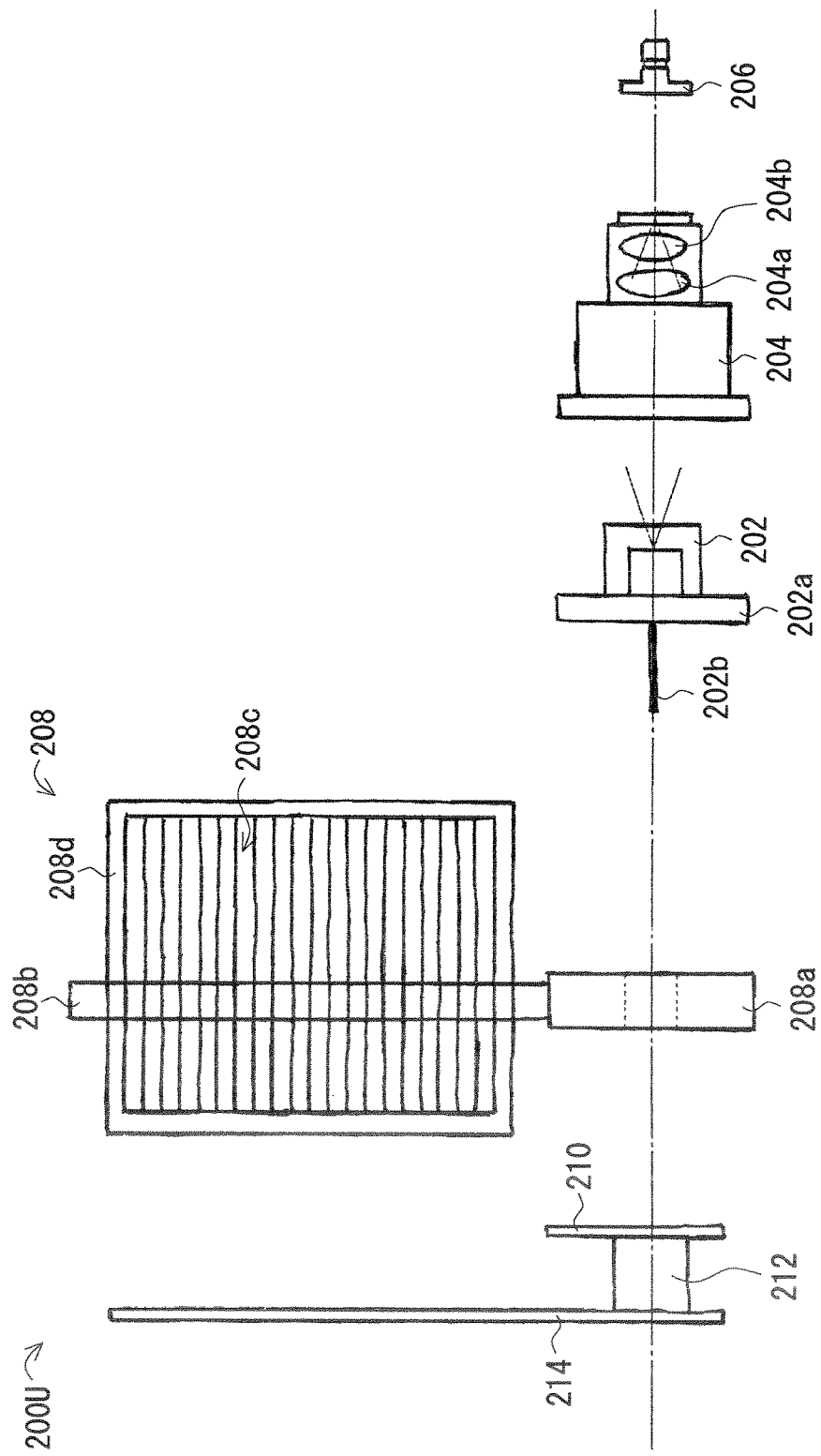
FIG. 5 is an exploded view illustrating the light source unit according to the preferred embodiment.

FIGS. 4 and 5 are an outer view and an exploded view exemplifying the laser light emitting unit 200U. In the example of FIGS. 4 and 5, the laser light emitting unit 200U includes a laser light source 202, a lens barrel 204, a receptacle 206, a heat pipe unit 208, a slave board 210, a flexible printed circuit board (FPC board) 212, and a drive circuit board 214.

Exemplified as the laser light source 202 is a high-power multiemitter laser, which emits diverging light from a tip end by conducting to a lead portion 202b extending from a stem portion 202a. The lens barrel 204 includes condenser lenses 204a and 204b therein, and the receptacle 206 to connect an optical fiber 300 is attached to the tip end of the lens barrel 204. For example, the positions of the condenser lenses 204a and 204b are adjusted and fixed such that laser light emitted from the laser light source 202 is condensed to an end surface of the optical fiber 300 that is connected to the receptacle 206.

The heat pipe unit 208 exemplifies a cooling unit for radiating heat generated by the laser light source 202, and according to the example of the figures, includes a base portion 208a, a heat pipe portion 208b, a fin portion 208c, and a frame portion 208d.

The base portion 208a is intimately fixed to the stem portion 202a of the laser light source 202 by means of heat conductive grease (not shown) or the like. The base portion 208a portion has a hole through which the conducting lead portion 202b of the laser light source 202 passes. The heat pipe portion 208b stands on the base portion 208a and is joined to the base portion 208a in such a state. Joined to the heat pipe portion 208b are a plurality of fins of the fin portion 208c. The frame portion 208d surrounds the fin portion 208c. The frame portion 208d configures the refrigerant channel, as to be described below.

More specifically, the plurality of fins are provided in the frame portion 208d so that the refrigerant (air in this case) passes in the frame portion 208d, and the heat pipe portion 208b is provided so as to pass through these fins.

The lead portion 202b of the laser light source 202 passes through the hole of the base portion 208a to reach the slave board 210, and is electrically connected to a laser drive circuit (not shown) mounted on the drive circuit board 214 by way of the slave board 210 and the flexible printed circuit board 212. The slave board 210 and the flexible printed circuit board 212 are connected with each other by direct soldering, by means of a connector, or the like. The flexible printed circuit board 212 and the drive circuit board 214 are connected with each other in a similar manner.

The slave board 210 is intimately fixed to the base portion 208a by means of heat conductive grease (not shown) or the like. The flexible printed circuit board 212 is preferred to be highly heat conductive. Such a highly heat conductive FPC can be formed, for example, by attaching a highly heat conductive material, such as a heat conductive sheet, to a surface of an ordinary FPC board. The highly heat conductive FPC is excellent in heat radiation.

The drive circuit board 214 is located to face the frame portion 208d of the heat pipe unit 208. The drive circuit board 214 is fixed to the frame portion 208d by means of a screw or the like, with a heat conductive material (such as a heat conductive sheet) (not shown) being interposed therebetween. The drive circuit board 214 can be alternatively in direct contact with the frame portion 208d, without providing the heat conductive material. In this manner, the drive circuit board 214 faces the frame portion 208d of the heat pipe unit 208 and is fixed to the frame portion 208d so as to be capable of conducting heat.

In the laser light emitting unit 200U thus configured, the drive circuit on the drive circuit board 214 generates necessary current, which is supplied to the laser light source 202 by way of the highly heat conductive flexible printed circuit board 212 and the slave board 210. As a result, laser light is emitted. The laser light source 202 is equipped with the high-power multiemitter laser, so that large current of several to several tens of amperes flows. The highly heat conductive flexible printed circuit board 212 is capable of efficiently radiating heat generated due to such large current.

The heat pipe unit 208 is capable of radiating heat that is generated by the laser light source 202 and is transferred to the heat pipe unit 208 by way of the base portion 208a. The heat pipe unit 208 is also capable of radiating heat that is generated by the drive circuit board 214 and is transferred to the heat pipe unit 208 by way of the frame portion 208d.

In this manner, the laser light source 202 and the drive circuit board 214 share the heat pipe unit 208. The laser light emitting unit 200U can be thus simplified in structure, reduced in size and cost, and the like, in comparison to a structure having a cooling unit for each of the laser light source 202 and the drive circuit board 214.

The laser light source 202 and the drive circuit board 214 are electrically connected to each other with the flexible printed circuit board 212 being interposed therebetween. Alternatively, the laser light source 202 and the drive circuit board 214 can be directly connected to each other, in which case the laser light emitting unit 200U is inevitably increased in size as compared with the above configuration. More specifically, the drive circuit board 214 will be made in contact with the base portion 208a. In such a configuration, the drive circuit board 214 needs to be located so as to extend oppositely from the frame portion 208d. In this case, the drive circuit board 214 cannot face the frame portion 208d.

On the other hand, with use of the flexible printed circuit board 212, the drive circuit board 214 can be located apart from the base portion 208a. The drive circuit board 214 can thus face the frame portion 208d, as a result of which the laser light emitting unit 200U can be reduced in size.

Furthermore, in a case where the drive circuit board 214 is fixed to the frame portion 208d and then the drive circuit board 214 and the flexible printed circuit board 212 is soldered to each other, there is no need to retain the drive circuit board 214 by means of a jig or the like during soldering. There is thus exerted preferred assembling performance.

Figure 6:
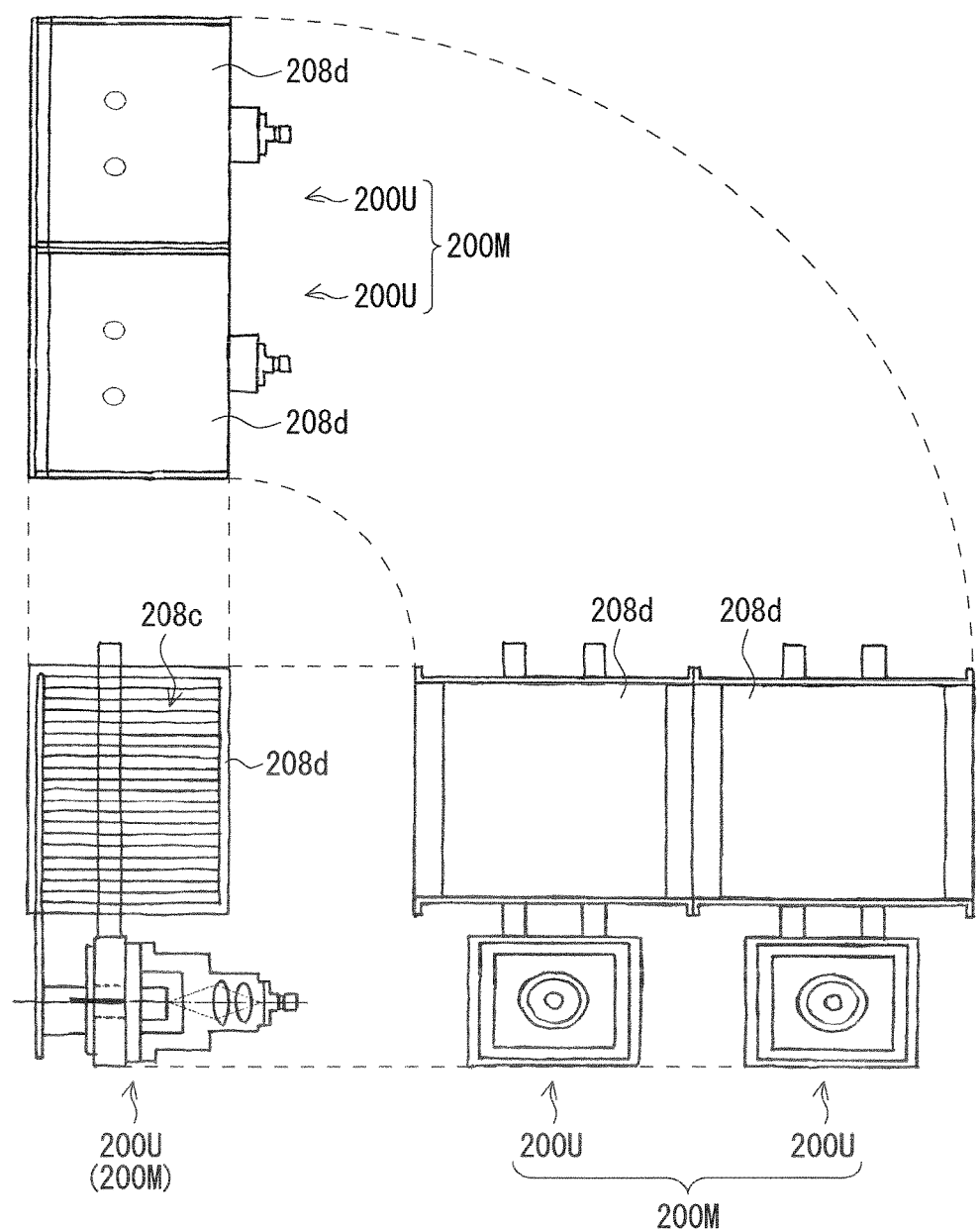
FIG. 6 is an outer view illustrating a light source module according to the preferred embodiment.

FIG. 6 is an exemplary outer view of the laser light emitting module 200M. In the example of FIG. 6, the laser light emitting module 200M is composed of two laser light emitting units 200U, which are connected with each other by coupling the frame portions 208d of the heat pipe units 208. For example, a coupling sheet metal member (not shown) can be provided along the two frame portions 208d and fixed to each of the frame portions 208d by means of screws or the like, so as to couple these two units 200U. It is possible to alternatively employ any other coupling means.

In the laser light emitting module 200M, opening ends of the two frame portions 208d are connected with each other, so that these two frame portions 208d form a continuous refrigerant channel. Such a continuous refrigerant channel is connected to the duct 102 serving as a common refrigerant channel, and air thus flows as exemplified by the dashed lines in FIGS. 2 and 3.

More specifically, as exemplified in FIGS. 1 to 3, five laser light emitting modules 200M are arrayed in the X direction on the half of the −Y direction when viewed from the duct 102. Accordingly, the X direction as illustrated in these figures can be considered an array direction of the light source modules 200M. In each of the modules 200M, the two laser light emitting units 200U are arrayed in the Y direction (−Y direction). The opening portion of the frame portion 208d of the laser light emitting unit 200U located closer to the duct 102 is connected to an opening portion (not shown) of the duct 102.

The laser light emitting unit 200U can be coupled with the duct 102 by fitting the frame portion 208d in the opening portion of the duct 102, for example. Alternatively, the laser light emitting unit 200U and the duct 102 can be coupled with each other by engaging a claw portion (not shown) provided at the opening portion of the frame portion 208d to an edge of the opening portion of the duct 102. Still alternatively, a flange portion of the frame portion 208d can be fixed to an outer wall 102a of the duct 102 by means of a screw or the like.

It is possible to employ various coupling measures, while the laser light emitting module 200M can be attached to or detached from the duct 102, in other words, the laser light emitting module 200M can be inserted into or extracted from the casing 100, separately for each of the modules 200M. The modules 200M are attached or detached by shifting in the Y direction.

The lid member (not shown) covering each of the opening portions 100c of the casing 100 is provided with an opening portion at a position opposite to the frame portion 208d of the laser light emitting unit 200U farther from the duct 102. There is thus securely provided the channel between the outside of the casing and the duct 102 through the two continuous frame portions 208d, as exemplified by the dashed lines in FIGS. 2 and 3.

A configuration similar to the above is employed in the half of the +Y direction when viewed from the duct 102.

In the example of FIG. 1, each of the laser light emitting units 200U is located in the casing 100 such that the receptacle 206 serving as a laser light window is positioned close to the bottom surface portion 100b of the casing and the fin portion 208c is located far from the bottom surface portion 100b of the casing.

In particular, the laser light window is directed to the bottom surface portion 100b of the casing, and a laser light emitting direction U (hereinafter, also referred to as U direction) is inclined at a predetermined angle θ from the X direction when viewed in the Y direction (see FIG. 1). Such an angle θ is, for example, determined so as to satisfy the condition that the laser light emitting direction U does not intervene in the other laser light emitting units 200U as well as the condition that the optical fiber 300 led from the receptacle 206 onto the bottom surface portion 100b of the casing is not curved excessively. Furthermore, the laser light emitting directions U of the laser light emitting units 200U are set to be in parallel with one another when viewed in the Y direction.

The laser light emitting units 200U can have the laser light sources 202 that are configured to have same or different specifications (such as output wavelengths). In a case where the light source apparatus 1 serves as a light source of a projector, the laser light sources 202 having wavelengths for red, green, and blue are provided in combination. Similarly, the lens barrels 204, the heat pipe units 208, the drive circuit boards 214, and the like in the units 200U can be configured to have same or different specifications. These options are applicable to both of the units 200U included in one of the modules 200M and the units 200U included in the different modules 200M.

<Light Guide Lines 300>

An optical fiber is exemplified as the light guide line 300, which is thus also referred to as the optical fiber 300. It is noted that the light guide line 300 is not limited to such an optical fiber. Alternatively, a hollow tube having an inner wall provided with reflection coating can be employed as the light guide line 300.

Figure 7:
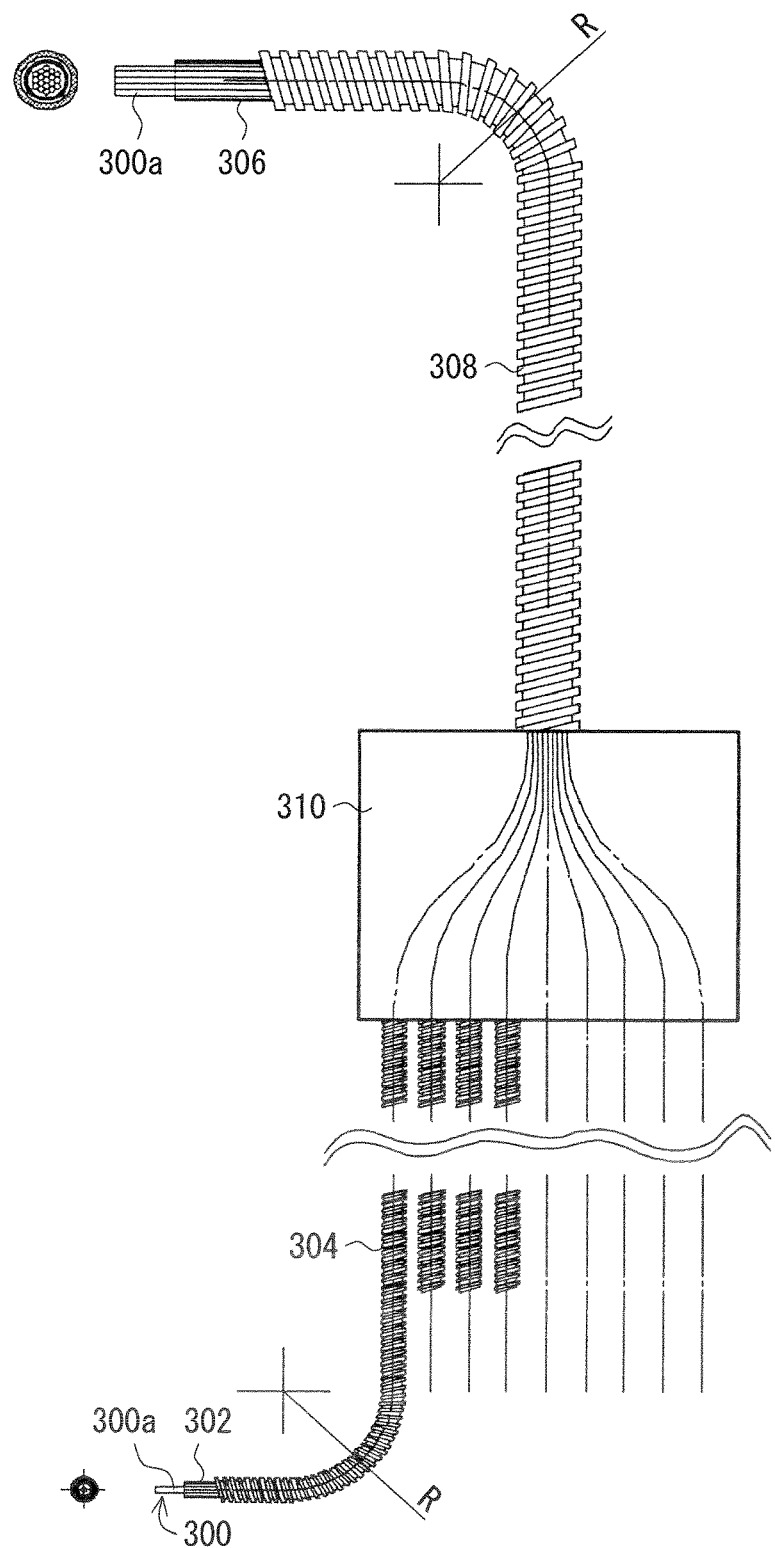
FIG. 7 is an outer view illustrating light guide lines according to the preferred embodiment.

FIG. 7 is an exemplary outer view illustrating the optical fibers 300. As apparent from FIG. 7 as well as FIGS. 1 and 3, the optical fibers 300 are led respectively from the laser light emitting units 200U, and are bundled together in the casing 100 and are led to outside the casing 100.

More specifically, each of the optical fibers 300 has an end portion connected to the receptacle 206 (see FIG. 5) of corresponding one of the laser light emitting units 200U. Each of the optical fibers 300 is depicted as an optical fiber body portion 300a in the example of FIG. 7. Each of the optical fiber body portions 300a is made of quartz glass or the like, and has a core portion and a clad portion surrounding the core portion. The optical fiber body portions 300a are each covered with a protective tube 302 made of polyvinyl chloride or the like, in order to protect the optical fiber body portions 300a from damage.

Furthermore, the optical fibers 300 covered with the protective tubes 302 are each inserted into an exterior tube 304 made of stainless steel or the like. Flexible tubes are exemplified herein as the exterior tubes 304. More specifically, the flexible tubes are selected because they have curving degree ranged correspondingly to restrict the inner optical fibers 300 (More particularly the optical fiber body portion 300a) from curving beyond acceptable curving degree.

When the optical fiber body portion 300a is curved in a region smaller than a predetermined radius (R) that is set in accordance with its outer diameter, material, and the like, a breakage of fiber or a reliability decrease of laser light transmission is caused, for example. Such breakage and the like can be prevented by inserting the optical fibers 300 into the exterior tubes 304 that are not curved in a region smaller than the predetermined radius (R). Moreover, handling properties of the optical fibers 300 are improved by prevention of the breakage and the like.

The optical fibers 300 led respectively from the laser light emitting units 200U are bundled together and covered with a protective tube 306 made of polyvinyl chloride or the like. The optical fibers 300 thus bundled and covered with the protective tube 306 are inserted into an exterior tube 308 made of stainless steel or the like. Selected as this common exterior tube 308 is also a flexible tube that is capable of restricting the inner optical fibers 300 from curving excessively. The bundled optical fibers 300 can be thus prevented from breakage and the like.

The exterior tubes 304 and 308 are connected to a bundling member 310, which bundles the optical fibers 300. The bundling member 310 is a hollow case made of stainless steel, for example. This case has a first surface (lower surface in FIG. 7) to which each of the exterior tubes 302 are attached, and a second surface (upper surface in FIG. 7), opposite to the first surface, to which the common exterior tube 306 is attached. The optical fibers 300 extend through both of the exterior tubes 304 and 308 by way of the bundling member 310 and are bundled accordingly.

As exemplified in FIG. 1, the optical fibers 300 are led from the laser light emitting units 200U along the X direction into a space between the plurality of light source modules 200M and the bottom surface portion 100b of the casing. More specifically, the optical fibers 300 are led from the laser light emitting units 200U toward the bottom surface portion 100b of the casing at the predetermined angle θ corresponding to the laser light emitting direction U, and gradually curve to reach the bottom surface portion 100b of the casing. On the bottom surface portion 100b of the casing, the optical fibers 300 extend in the X direction.

This configuration effectively utilize the gap between the laser light emitting units 200U and the bottom surface portion 100b of the casing, thereby achieving reduction in allocation space (forming space) for the optical fibers 300. This leads to reduction in size of the light source apparatus 1.

For example, in the apparatus described in Japanese Patent Application Laid-Open No. 2009-253074, there are provided, on the installation plate, both the allocation space for the plurality of laser light emitting units and the allocation space (forming space) for the optical fibers. More specifically, the installation plate has a center region serving as the allocation space for the optical fibers, which are led from both sides of the center region toward the center region. In this configuration, as the number of laser light emitting units increases, the allocation space for optical fibers needs to be further enlarged. This leads to significant increase in allocation area for the apparatus.

To the contrary, in the light source apparatus 1 according to the present preferred embodiment, even if the case where the laser light emitting module 200M includes two units 200U is compared with the case where the module 200M includes only one unit 200U, the allocation area for the apparatus corresponds only to the number of the laser light emitting units 200U. The height of the light source apparatus 1 is unchanged even when the number of laser light emitting units 200U increases. The light source apparatus 1 according to the present preferred embodiment is thus advantageous in terms of reduction in size.

The optical fibers 300 extending on the bottom surface portion 100b of the casing gradually curve to be collected, and are then bundled by the bundling member 310 as mentioned earlier. In the example of FIGS. 1 to 3, the bundling member 310 is located at the center of an upper portion on a side surface portion 100d opposite to the side surface portion 100a to which the fan 104 is attached. The common flexible tube 308 bundling the optical fibers 300 is led from the upper portion of the casing 100 to outside. The tip ends of the bundled optical fibers 300 are fixed so as to emit laser light toward a rod of the projector (not shown).

<Attaching/Detaching Module 200M>

Figure 8:
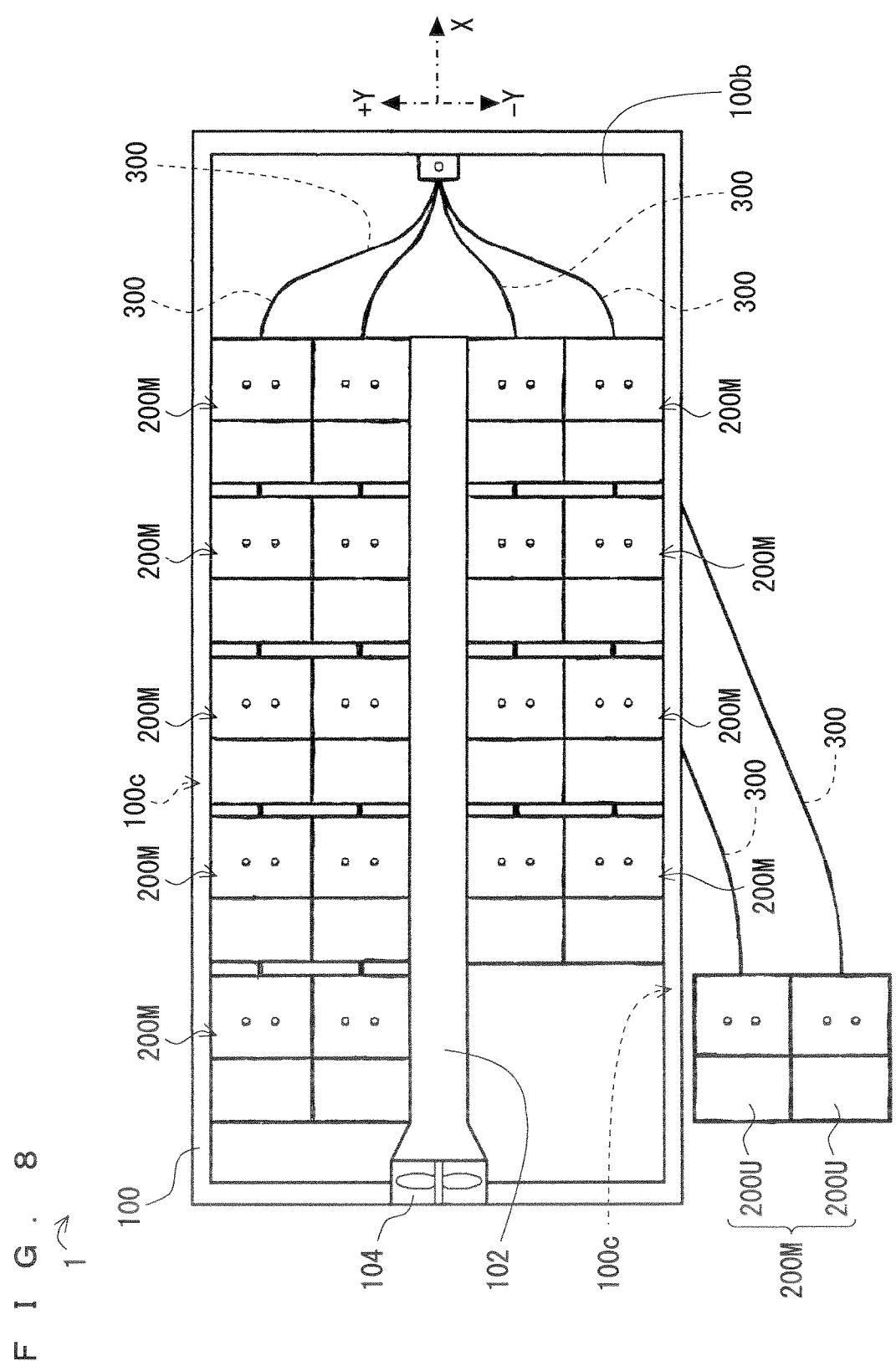
FIG. 8 is a top view illustrating a state where one of the light source modules is detached in the preferred embodiment.
Figure 9:
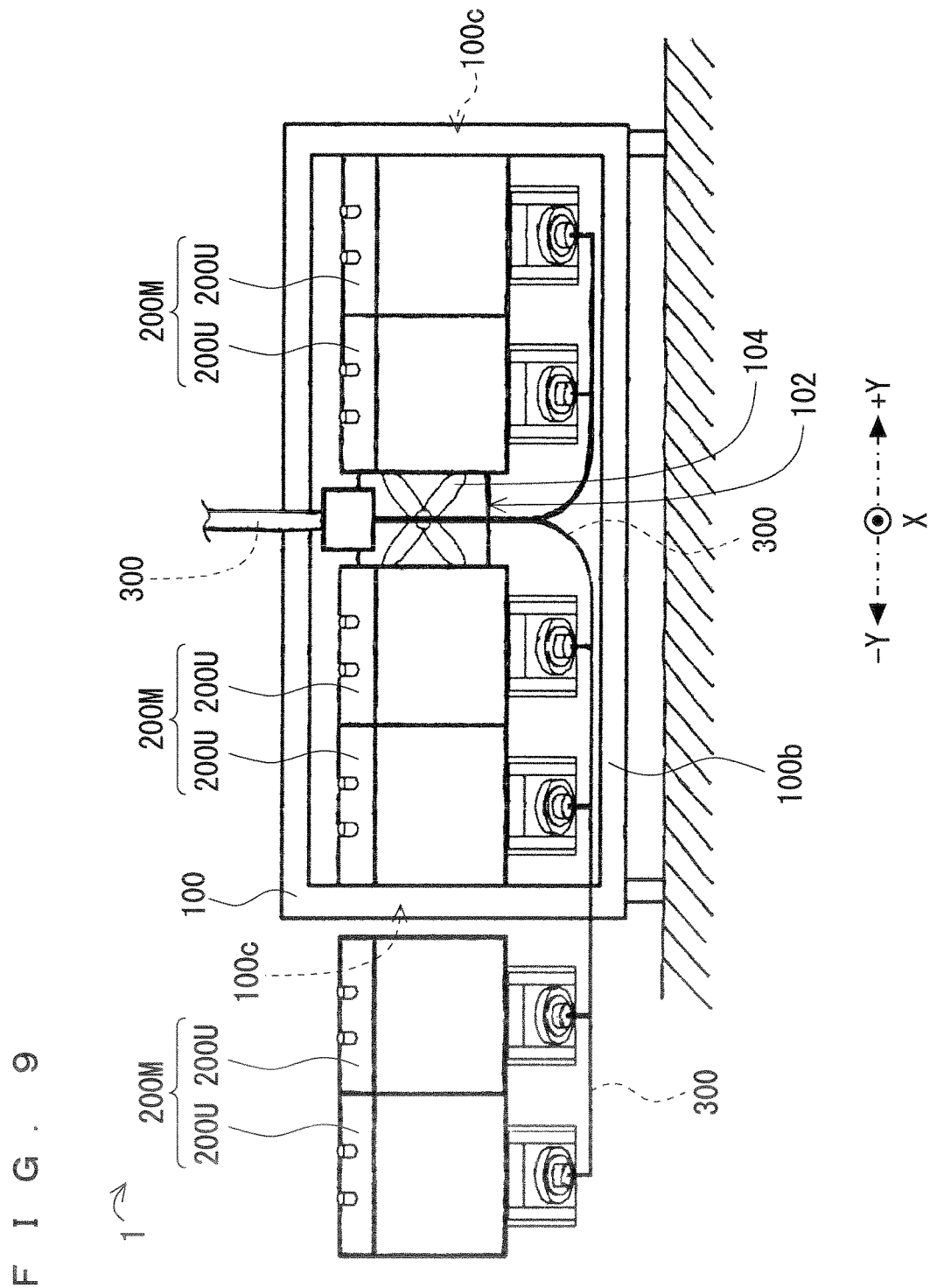
FIG. 9 is a side view illustrating a state where one of the light source modules is detached in the preferred embodiment.

FIGS. 8 and 9 exemplify the state where one of the laser light emitting modules 200M is detached. FIG. 8 is a top view corresponding to FIG. 2, whereas FIG. 9 is a side view corresponding to FIG. 3.

In the configuration described above, the laser light emitting modules 200M can be attached and detached through the opening portions 100c of the casing 100 by shifting in the Y direction. In particular, as exemplified in FIGS. 8 and 9, each of the laser light emitting modules 200M can be attached and detached separately from the other modules. The optical fibers 300 are led so as not to intervene in any of the laser light emitting modules 200M when viewed in the Y direction, thereby the optical fibers 300 do not disturb attachment and detachment of any of the laser light emitting modules 200M. Moreover, the optical fibers 300 can be easily attached and detached in the state where the corresponding laser light emitting module 200M is located outside the casing 100 as shown in FIGS. 8 and 9. The light source apparatus 1 thus achieves preferred maintenance performance.

Unlike the apparatus described in Japanese Patent Application Laid-Open No. 2009-253074, it is unnecessary to provide large-scale slider means for attaching and detaching the laser light emitting modules 200M. Thus achieved are reduction in size, reduction in cost, and the like.

Furthermore, the heat pipe unit 208 is provided to each of the laser light emitting units 200U, which also achieves preferred maintenance performance.

MODIFICATION EXAMPLES

Unlike the example described above, the apparatus can be configured without including the duct 102. In such a case, the laser light emitting modules 200M are attached to a portion other than the duct 102, a dedicated support member, for example. In this case where the duct 102 is not provided, in each of the modules 200M, the opening portions of the frame portions 208d of the heat pipe units 208 are not necessarily coupled to each other.

Depending on the amount of heat generated by the light source portion and the like, the apparatus can be configured without one or both of the fan 104 and the heat pipe unit 208.

Such light source apparatuses 1 can be stacked so as to form a structure of double layers, triple layers, and the like.

While the invention has been shown and described in detail, the foregoing description is in all aspects illustrative and not restrictive. It is therefore understood that numerous modifications and variations can be devised without departing from the scope of the invention.

What is claimed is:

1. A light source apparatus comprising:
    a plurality of light source modules each including at least one light source unit;
    light guide lines connected respectively to said light source units in such manner that each of the light guide lines is connected to a different one of the light source units; and
    a casing accommodating said plurality of light source modules and said light guide lines, wherein
    said light guide lines are led along paths from the respective light source units to a bundling member which bundles together said light guide lines of said plurality of light source modules so that said light guide lines remain bundled together when exiting the casing,
    said plurality of light source modules are arrayed in a first direction relative to the casing, and mounted inside the casing so as to suspend above a bottom surface of the casing thereby creating a space along the first direction between the light source modules and the bottom surface of the casing, each of said light guide lines being led unbundled from the respective light source unit into the space and through the space along the first direction to the bundling member so that none of the others of said plurality of light source modules intervenes in the path of said light guide line, when viewed in a second direction relative to the casing which is perpendicular to the first direction,
    wherein a direction in which each of said light guide lines is led directly from the respective light source unit toward the bottom surface of the casing is inclined at a predetermined angle less than 90 degrees from the first direction,
    a light emitting direction of each of the light source units is inclined at said predetermined angle from the first direction, so that said light emitting direction is parallel to said direction in which the corresponding light guide line is led from the light source unit, and
    said plurality of light source modules are separately attachable and detachable in said second direction.

2. The light source apparatus according to claim 1, wherein said light guide lines are led from said light source units along said first direction of said plurality of light source modules into the space between said plurality of light source modules and a bottom surface portion of said casing, so as to extend on said bottom surface portion of said casing.

3. The light source apparatus according to claim 1, wherein each of said light source modules includes a plurality of light source units coupled to each other in said second direction.

4. The light source apparatus according to claim 2, wherein each of said light source modules includes a plurality of light source units coupled to each other in said second direction.

5. The light source apparatus according to claim 1, wherein said light source unit includes a cooling unit for radiating heat generated by a light source portion.

6. The light source apparatus according to claim 2, wherein said light source unit includes a cooling unit for radiating heat generated by a light source portion.

7. The light source apparatus according to claim 3, wherein said light source unit includes a cooling unit for radiating heat generated by a light source portion.

8. The light source apparatus according to claim 4, wherein said light source unit includes a cooling unit for radiating heat generated by a light source portion.

9. The light source apparatus according to claim 3, wherein
    said light source unit includes a cooling unit for radiating heat generated by a light source portion, said cooling unit has a refrigerant channel, and
    said refrigerant channels of said plurality of light source units form a continuous channel.

10. The light source apparatus according to claim 4 wherein
    said light source unit includes a cooling unit for radiating heat generated by a light source portion, said cooling unit has a refrigerant channel, and
    said refrigerant channels of said plurality of light source units form a continuous channel.

11. The light source apparatus according to claim 5, wherein
    said light source unit further includes a board equipped with a drive circuit for said light source portion, and
    said board is fixed to said cooling unit so as to face said cooling unit and be heat conductive.

12. The light source apparatus according to claim 6, wherein
    said light source unit further includes a board equipped with a drive circuit for said light source portion, and
    said board is fixed to said cooling unit so as to face said cooling unit and be heat conductive.

13. The light source apparatus according to claim 7, wherein
    said light source unit further includes a board equipped with a drive circuit for said light source portion, and
    said board is fixed to said cooling unit so as to face said cooling unit and be heat conductive.

14. The light source apparatus according to claim 8, wherein
    said light source unit further includes a board equipped with a drive circuit for said light source portion, and
    said board is fixed to said cooling unit so as to face said cooling unit and be heat conductive.

15. The light source apparatus according to claim 9, wherein
said light source unit further includes a board equipped with a drive circuit for said light source portion, and
said board is fixed to said cooling unit so as to face said cooling unit and be heat conductive.

16. The light source apparatus according to claim 10, wherein
said light source unit further includes a board equipped with a drive circuit for said light source portion, and
said board is fixed to said cooling unit so as to face said cooling unit and be heat conductive.

17. The light source apparatus according to claim 1, wherein each of said light guide lines is inserted into an exterior tube restricting said light guide line from curving beyond acceptable curving degree.

\* \* \* \* \*